United States Patent [19]

Ohike

[11] Patent Number: 5,062,135
[45] Date of Patent: Oct. 29, 1991

[54] CROSS COIL TYPE INDICATING GAUGE
[75] Inventor: Yukio Ohike, Shimada, Japan
[73] Assignee: Yazaki Corporation, Tokyo, Japan
[21] Appl. No.: 430,330
[22] Filed: Nov. 2, 1989
[30] Foreign Application Priority Data Nov. 9, 1988 [JP] Japan ............................ 63-145361[U]
Nov. 9, 1988 [JP] Japan ............................ 63-145362[U]

[51] Int. Cl.⁵ .............................................. G01R 1/20
[52] U.S. Cl. ......................... 324/154 R; 324/154 PB;
324/155; 324/146; 74/526; 116/297
[58] Field of Search .................... 74/526, 527, 531;
116/291, 297, 314; 324/154 R, 154 PB, 155,
146, 147

[56] References Cited
U.S. PATENT DOCUMENTS 2,262,008 11/1941 Kollsman .......................... 116/291
2,855,567 10/1958 Lamb ................................ 116/291
3,126,863 3/1964 Feu .................................... 116/297
3,390,332 6/1968 Rappoccio ...................... 324/154 R
3,564,929 2/1971 Halstead ........................... 74/526
3,577,078 5/1971 Kisselmann ................... 324/154 R
4,155,623 5/1979 Schultz ............................. 74/526

4,646,007 2/1987 Faria ................................. 116/297

FOREIGN PATENT DOCUMENTS 55-100172 7/1980 Japan .

Primary Examiner—Kenneth A. Wieder
Assistant Examiner—Jose M. Solis
Attorney, Agent, or Firm—Venable, Baetjer, Howard & Civiletti

[57]   ABSTRACT

An indicating gauge for automobiles for displaying the amount of a measurement on a gauge board by a movement. The movement comprises a pair of coils for generating a combined magnetic field in response to a predetermined measurement amount, a magnet rotor having a rotation shaft rotating dependent on the generated magnetic field, a counter shaft rotatably disposed in parallel to the rotating shaft, a pointer mounted on the tip of the counter shaft, a rotation gear secured to the rotation shaft and a counter gear secured to the counter shaft. To fix the pointer to 0 position of the gauge board, a stopper is provided in the counter gear. This obviates the another stopper on the gauge board. The number of parts is reduced, and assembling the gauge can be done easily.

10 Claims, 4 Drawing Sheets 5,062,135

CROSS COIL TYPE INDICATING GAUGE

BACKGROUND OF THE INVENTION

1. Field of the Invention

The present invention relates to a cross coil type indicating gauge, particularly to a cross coil type indicating gauge mounted on automobiles and suitable for speed meters, tachometers, boost gauges, oil pressure gauges, etc.

2. Description of the Prior Art

An indicating gauge for automobiles has been widely used in the past, in which a current that varies in response to the amount of a measurement is caused to flow through a pair of coils that generate magnetic fields at right angles to each other, said pair of coils cause a magnet rotor to rotate in the direction of the combined magnetic field which is formed of the magnetic fields generated by each of said pair of coils, and the measurement amount is displayed by means of a pointer rotating together with the magnet rotor.

This kind of conventional indicating gauge is formed of a cross coil in which two coils are wound at right angles to each other on the outside of a coil bobbin. In the center of the inside of this coil bobbin is disposed a magnet rotor held rotatably inside said cross coil and in which the south pole and the north pole are formed at diametrically symmetrical positions. A rotation shaft passing through said cross coil is secured to the center of said magnet rotor. The movement of a gauge is formed by the above-described arrangement. The above movement is mounted on the rear side of a gauge board, and the pointer is mounted to the tip of said rotation shaft passing through said gauge board, which forms an indicating gauge.

In the conventional indicating gauge described above, a current that varies in response to the amount of a measurement is caused to flow through each of the above coils. This causes the magnet rotor to rotate in the direction of the combined magnetic field which is formed of the combined magnetic fields generated by each of the coils, which causes the above pointer to rotate via said rotation shaft to display the amount of a measurement.

In recent years, one such that a plurality of said indicating gauges are arranged on a single gauge board for improved space efficiency has appeared. For example, when two movements are used, those movements are arranged in parallel, and a pointer mounted on each rotation shaft is arranged in the front of a single gauge board. However, in such an arrangement, the problem that each rotation shaft is located apart from the other, making the distance between the pointers great, has been posed.

For this reason, there has been one from the past such that a rotation gear is secured to said rotation shaft, a counter shaft to which a counter gear that engages this rotation gear is secured, is rotatably disposed to a coil bobbin, and the rotation center of said pointer is off-centered from the rotation shaft. This enables the pointers to be closely disposed even when two movements are disposed in parallel, with the result that the distance between the pointers becomes small, and space can efficiency be utilized. Furthermore, if three movements are used and the counter shafts of the movements are disposed closely, the three pointers will be formed in such a layout that each of them radially extends from the center of the gauge board, further improving space efficiency.

In the above indicating gauge whose pointer is off-centered, when returning said pointer to the 0 position of the gauge board, a hair spring is mounted on said counter shaft, and said pointer is made to return by the energization force of said hair spring under the condition that said coil is not supplied with electric current, and the magnet rotor is not applied with a torque. As a means of stopping this pointer at the 0 position, conventionally, a stopper pin is projected in the 0 position of a gauge board, and said pointer is stopped by means of this stopper pin.

In the conventional indicating gauge described above, generally, teeth have been formed only to portions needed to rotate said pointer to a predetermined angle in a counter gear, and said counter gear is secured so that the end parts of the tooth formed part correspond to the 0 position indicated by said pointer. However, since said counter shaft is energized by a hair spring, said counter gear may rotate by this energization force after said counter gear is mounted. So, there is a possibility that the engagement of the tooth-formed part of said counter gear and the rotation gear may slip out of place, and the problem that the work of securing the counter gear to said counter shaft is difficult, is posed. Moreover, a stopper pin must be formed in said gauge board so that said counter gear will not rotate to the position at which portions other than said tooth-formed parts correspond to the rotation gear. This results in an increase in the number of parts, leading to increased assembly processess.

In light of the above-described deficiencies, the present invention has been devised. An object of the invention is to provide a cross coil type indicating gauge capable of returning a pointer reliably to the 0 position without forming a stopper pin in an gauge board, and for which assembly of counter gears is easy.

Another object of the invention is to provide a cross coil type indicating gauge of which the number of parts can be reduced, and that can be manufactured easily and at a low cost.

SUMMARY OF THE INVENTION

To achieve the above purposes, the cross coil type indicating gauge involved in the present invention includes a gauge board and at least one movement mounted to said gauge board, wherein said movement comprises a cross coil with two coils wound to a coil bobbin at right angles to each other, a magnet motor disposed inside this cross coil and having a rotation shaft rotating a predetermined angle dependent on the magnetic field generated by the coil being electrically charged, a rotation gear secured to the top of the rotation shaft of said magnet rotor, a counter shaft rotatably disposed in parallel to said rotation shaft and having a counter gear engaging with said rotation gear, a pointer mounted to the tip of said counter shaft, and means for stopping the pointer to the 0 position of the gauge board.

According to the embodiment of the present invention, said stop means consists of a spring provided around the counter shaft, and a stopper formed in a counter gear.

According to the invention, the cross coil type indicating gauge is adapted to display a predetermined measurement amount in such a way that supply of a current dependent on a predetermined measurement amount to each coil causes a magnet rotor to rotate in the direction of the combined magnetic field which is formed of the magnetic fields generated by each coil, which causes a counter shaft to rotate via each of a rotation shaft, a rotation gear, and a counter gear to rotate a pointer in the gauge board. The counter shaft or the pointer is made to stop at the 0 position by means of a stopper formed in said counter gear. Thus, when mounting a counter gear to said counter shaft, the counter gear can reliably be mounted to the position corresponding to the 0 position of the gauge board by mounting said stopper to the position in contact with the teeth of said rotation gear. Moreover, even when a restoring energization force is applied to said counter shaft, the mounting position of the transfer gear does not deviate owing to the stopper, thereby facilitating an assembly work. Furthermore, the number of parts can be decreased as a stopper pin is not needed to be installed in the gauge board.

The embodiments of the present invention will now be explained with reference to the accompanying drawings.

DETAILED DESCRIPTION OF THE INVENTION

Figure 1:
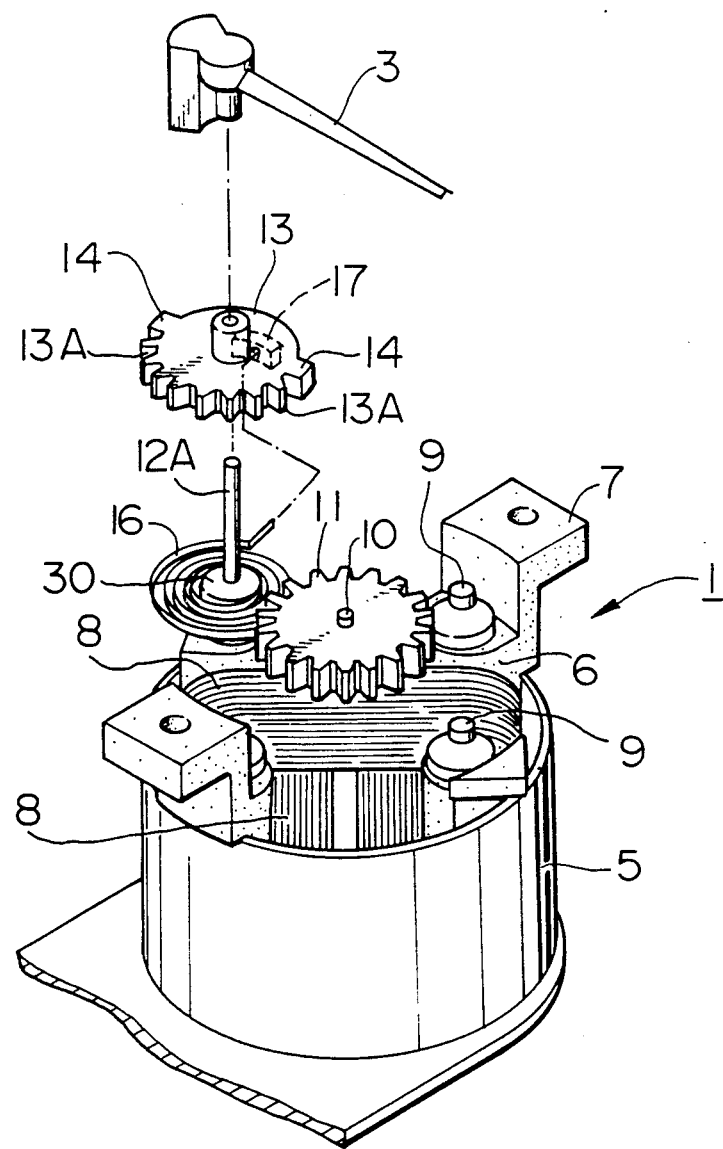
FIG. 1 is a perspective view illustrating the movement part of the cross coil type indicating gauge in accordance with the embodiment of the present invention.

Referring to FIG. 1, the movement part 1 of the cross coil type indicating gauge of the invention includes a case body 5 for shielding magnetic fields, being cylindrical and one end being open. A coil bobbin 6 is housed inside the case body 5. Flanges 7, 7 for fixing to the rear side of a gauge board 2 (FIG. 4) are projected at the diametrically symmetrical positions around this coil bobbin 6. Two coils 8, 8 are wound to the coil bobbin 6 so as for them to intersect at right angles. A terminal 9 for electrically charging each of the coils 8 is disposed around the coil bobbin 6. A disc-form magnet rotor 4 (FIG. 2) in which the south pole and the north pole are formed at diametrically symmetrical positions, is disposed inside each of said coils 8. A rotation shaft 10 extending in the axial direction of said coil bobbin 6 and rotatably held passing through each of the coils 8 is mounted in the center of the magnet rotor 4. The magnet rotor 4 is made to be rotable around the rotation shaft 10 in the condition of the coil 8 not being electrically charged, and is driven to rotate a predetermined angle by electrically charging each of the coils 8 via the terminal 9. A rotation gear 11 is co-axially mounted to the top of the rotation shaft 10. A counter shaft 12 disposed in parallel with the rotation shaft 10 is rotatably buried in one side of the coil bobbin 6. A counter gear 13 that engages said rotation gear 11 is mounted to the counter shaft 12. In addition, the tip of the counter shaft 12 is made to pass through the gauge board 2 under the condition that the movement 1 is mounted to the rear side of the gauge board 2 by the flange 7, and a pointer 3 is secured to the tip of said counter shaft 12. In the counter gear 13, teeth 13A are formed only on the portion where the pointer 3 can rotate in the arrow F direction (FIG. 4) from the 0 position 31 of the scale of the gauge board 2 through an intermediate position 32 to the maximum position 33, and stoppers 14 for blocking the engagement with the rotation gear 11 are formed on both ends of the tooth-formed portion A hair spring 16 is mounted to the counter shaft 12, and under the condition that the coil is not electrically charged and the magnet rotor can rotate freely, the counter shaft 12 is energized so that the pointer 3 returns to the 0 position. A bearing hole 7 extending in the up and down direction is formed around the coil bobbin, and the counter shaft 12 is rotatably held to this bearing hole 27. Upper and lower end parts 12A, 12B are formed in the counter shaft 12. The lower end part 12B of the counter shaft 12 is held by a spherical thrust bearing 29 (FIG. 2) buried in the bottom of the bearing hole 27, and the upper end part 12A of the counter shaft 12 is held by a bearing member 30 engaged to the upper end part of the bearing hole 27 so that the counter shaft 12 will not come out.

Figure 2:
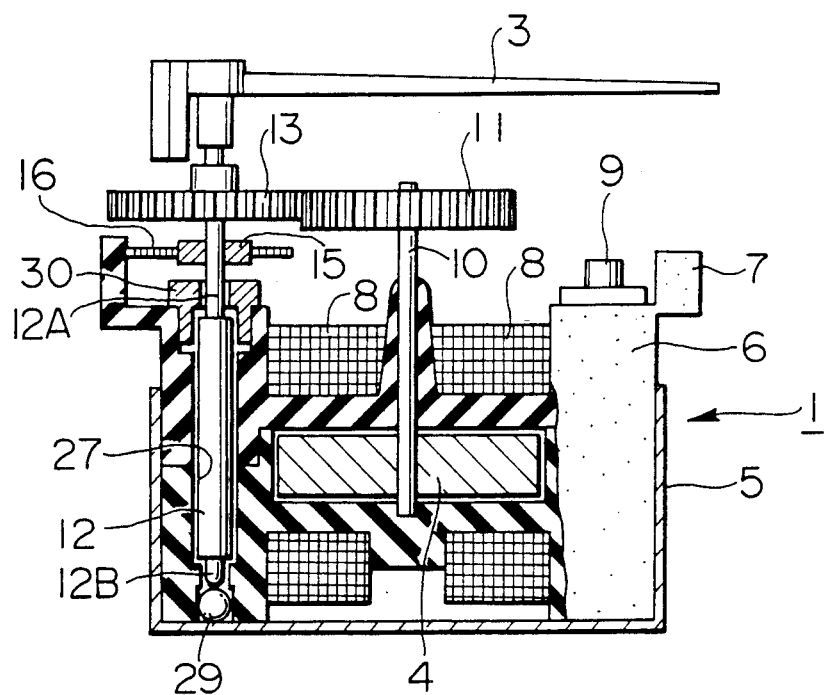
FIG. 2 is a longitudinal sectional view of the cross coil type indicating gauge of FIG. 1.

According to the embodiment of the invention shown in FIG. 2, a hair bead 15 is secured in the midway part of the counter shaft 12, and one end part of the hair spring 16 is secured to the hair bead 15. The other end part of the hair spring 16 is connected to the coil bobbin 2. Under the condition that the coil is not electrically charged and the magnet rotor 4 can freely rotate, the counter shaft 12 is energized so that the pointer 3 will return to the 0 position of the gauge board.

A current that varies in response to the amount of a measurement is supplied to each of the coils 8 via the terminal 9 according to the predetermined measurement amount. This causes the magnet rotor 4 to rotate an angle corresponding to the measurement amount, depending on the magnetic field which is formed of the magnetic fields generated by each coil 8. This causes the rotation shaft 10 to rotate, causing the counter shaft 12 to rotate via the rotation gear 11 and counter gear 13. The pointer 3 is made to rotate on the gauge board and to display said measurement amount. At this time, the hair spring 16 is rolled up by the rotation of the counter shaft 12, and an energization force has been accumulated.

Under the condition that each of the coil 8 is not electrically charged such as when an automobile is stopped, the magnet rotor can freely rotate, and the pointer 3 is rotated to return to the 0 position by the accumulated energization force of the hair spring 16 that is provided to the counter shaft 12.

Figure 3:
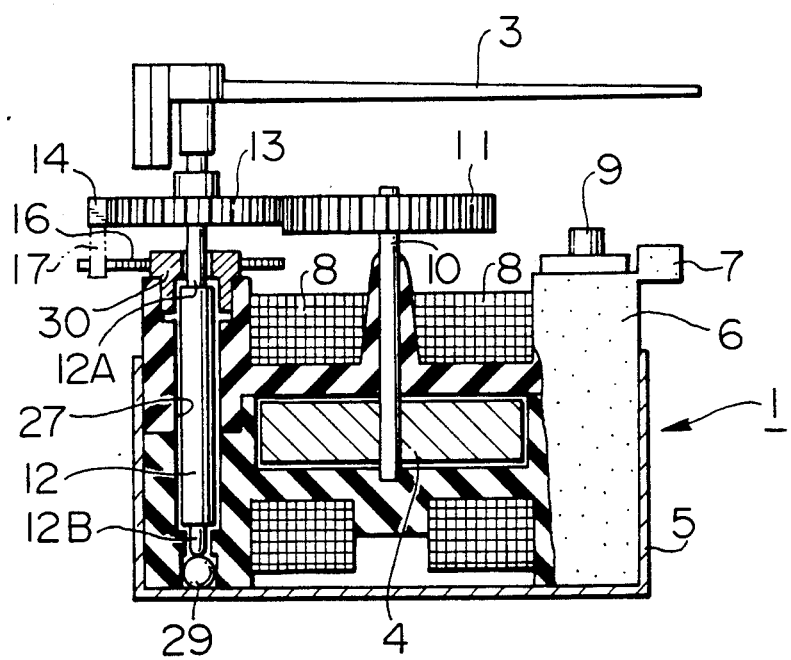
FIG. 3 is the same view as FIG. 2 illustrating another embodiment of the invention.

In the indicating gauge, the bearing member 30 and the hair spring 16 are separate members, but in the embodiment shown in FIG. 3, the bearing member 30 is made to serve as a hair bead. One end part of the hair spring 16 is secured around the surface of the bearing member 30, and the other end part is secured to a mounting pin 17 which is projected in the lower face side of the counter gear. Under the condition that the coil is not electrically charged and the magnet rotor can freely rotate, the counter shaft 12 is energized so as to return to the 0 position 31 on the gauge board 2 by the hair spring 16.

According to this embodiment, the hair spring is integrally formed to the bearing member, so a hair bead for securing a hair spring to the counter shaft becomes unnecessary. The number of parts can be decreased, and it can be manufactured easily and at a low cost.

Figure 4:
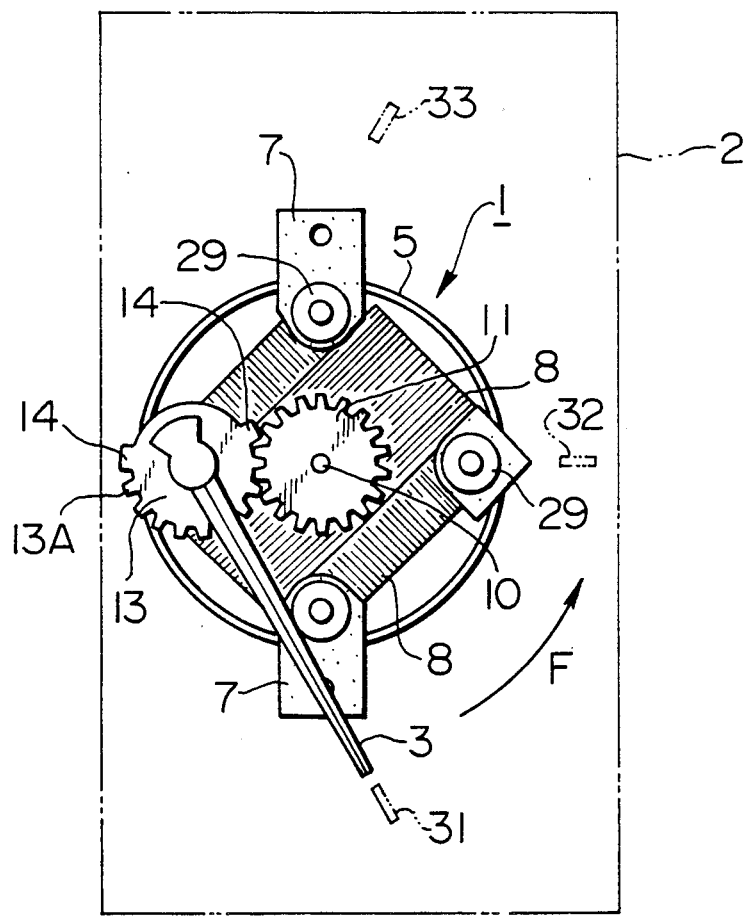
FIG. 4 is a plan view illustrating the state in which the movement part of the cross coil type indicating gauge of FIG. 1 is mounted to the gauge board.
Figure 5:
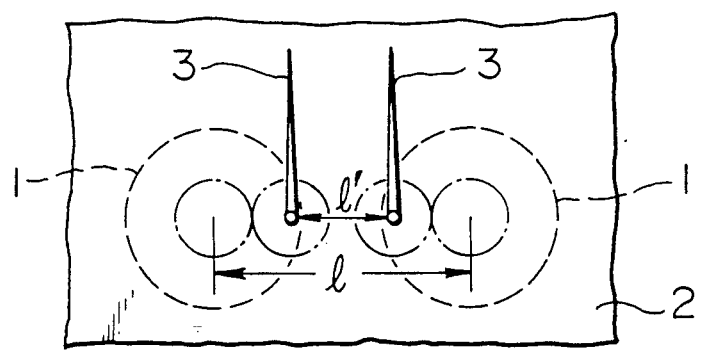
FIG. 5 is a plan view illustrating the indicating gauge of the invention using two movements.
Figure 6:
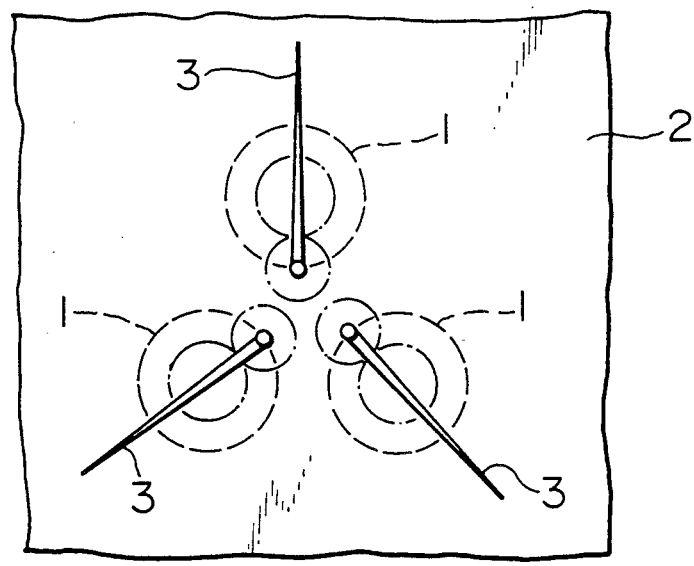
FIG. 6 is a plan view illustrating the indicating gauge of the invention using three movements.

The cross coil type indicating gauge of the present invention using two movements is shown in FIG. 4, and the cross coil type indicating gauge of the invention using three movements is shown in FIG. 5. In either case, the distance l' between each pointer is smaller than the distance l between the pointers directly installed to the rotation shaft without using the counter shaft, achieving improved space efficiency. Furthermore, according to the invention, means for stopping the pointer 3 to the 0 position is provided on the movement side, so a stopper need not be provided on the gauge board.

The operation of the embodiment of the invention shown in FIG. 1 will now be explained.

In the present embodiment, a voltage is supplied to the coils 8 via the terminal 9 respectively in accordance with a sine curve and a cosine curve according to a predetermined measurement amount, which causes the magnet rotor 4 to rotate an angle dependent on the measurement amount according to the combined magnetic field which is formed of the magnetic fields generated by each coil 8. This causes the rotation shaft 10 to rotate, causing the counter shaft 12 to rotate via the rotation gear 11 and counter gear 13. The pointer 3 is made to rotate on the gauge board 2 and to display the measurement amount. And an operator checks visually the measured speed, the revolution of an engine and the like by observing the pointer 3. At this time, said hair spring 16 is rolled up by the rotation of the counter shaft 12, and an energization force has been accumulated.

Under the condition that each of the coil 8 is not electrically charged such as when an automobile is stopped, the magnet rotor can freely rotate, and the pointer 3 is rotated until the stopper 14 of said counter gear 13 comes into contact with the rotation gear 11 to return to the 0 position by the energization force of the hair spring that is provided to the counter shaft 12.

In the embodiment shown in FIG. 3, the hair spring 16 is directly secured to the bearing member 30, and a hair bead is not used. Thus, when the counter shaft 12 is mounted to the bearing hole 27, the hair spring 16 can be installed at the same time the bearing member 30 is installed. As a result, the number of parts can be decreased, and it can be manufactured easily and at a low cost. The pointer 3 is made to stop at the 0 position by using the stopper formed in the counter gear 13. So when mounting the counter gear 13 to the counter shaft 12, the counter gear 13 can reliably be mounted to a position corresponding to the 0 position by mounting it to the position at which the stopper 14 is in contact with the teeth of the rotation gear. Moreover, when the counter shaft 12 is applied with an energization force by the hair spring 16, there is no possibility that the mounting position of the counter gear 13 may shift by the stopper 14. So assembling can be done easily. In addition, a stopper pin need not be provided on the gauge board 2, thereby decreasing the number of parts.

While the invention has been described on the basis of the embodiments, it is to be understood that the invention is not limited by any of the details of the description and various changes and modifications may be made in the invention without departing from the spirit and scope thereof.

What is claimed is:

1. A cross coil type indicating gauge for use with a gauge board having at least one predetermined minimum position and at least one maximum position, and at least one movement mounted to the gauge board, the movement comprising:

a pair of coils mounted onto a coil bobbin at substantially right angles to each other for receiving electric charge and generating a combined magnetic field in response to a predetermined measurement amount;

a rotation body disposed inside said pairs of coils and having a rotating shaft in the center thereof, for rotating through a predetermined angle dependent on said generated combined magnetic field;

counter indicating means having a counter shaft rotatably disposed in parallel to said rotation shaft and a pointer mounted on the tip of said counter shaft for rotating on said gauge board and indicating said predetermined measurement amount;

torque transmission means including a rotation gear secured to said rotation shaft, and a counter gear secured to said counter shaft and having a tooth formed portion for engaging with said rotation gear for the rotation angle of said pointer; and means mounted to said counter gear for stopping said pointer at said predetermined minimum position of said gauge board.

2. A cross coil type indicating gauge as claimed in claim 1, wherein said pointer stopping means comprises a hair spring disposed around said counter shaft and stopper means disposed along at least one end of said tooth formed portion of said counter gear.

3. A cross coil type indicating gauge as claimed in claim 2, wherein said stopper means is formed at both ends of said tooth-formed portion, for blocking engagement with said rotation gear beyond the range from the predetermined minimum position to the maximum position.

4. A cross coil type indicating gauge as claimed in claim 2, wherein said hair spring is secured to the hair bead secured to said counter shaft.

5. A cross coil type indicating gauge as claimed in claim 2, wherein one of the ends of said hair spring is secured to the hair bead secured to said counter shaft, and the other end thereof is connected to said coil bobbin.

6. A cross coil type indicating gauge as claimed in claim 2, wherein said hair spring is integrally secured to a holding body holding said counter shaft.

7. A cross coil type indicating gauge as claimed in claim 2, said hair spring is integrally secured to a bearing member disposed in a bearing hole formed in said coil bobbin.

8. A cross coil type indicating gauge as claimed in claim 7, wherein one of the ends of said hair spring is secured to a surrounding surface of said bearing member, and the other end is secured to a mounting pin which is projected in the lower face side of said counter gear.

9. A cross coil type indicating gauge for use with a gauge board having at least one predetermined minimum position and at least one maximum position, and at least one movement mounted to the gauge board, the movement comprising:

a case body for housing a coil bobbin and a bearing member;

a cross coil with two coils wound in such directions that said two coils intersect each other into said coil bobbin;

means for electrically charging into said cross coil and generating a combined magnetic field in said cross coil in response to a predetermined measurement amount;

a magnet rotor disposed inside said cross coil and having a rotation shaft for rotating a predetermined angle dependent on said generated combined magnetic field;

a rotation gear secured to the top of the rotation shaft of said rotor;

a counter shaft rotatably disposed in parallel to said rotation shaft and received by said bearing member;

a pointer mounted on the tip of said counter shaft and being rotatable with said counter shaft on said gauge board for providing an indication as to said predetermined measurement amount;

a counter gear secured to said counter shaft, said counter gear having a tooth formed portion for engaging with said rotation gear for the rotation angle of said pointer from the predetermined minimum position to the maximum position and a stopper disposed at least on one end of said tooth formed portion; and a hair spring secured to said bearing member and mounted around said counter shaft.

10. A cross coil type indicating gauge as claimed in claim 1, wherein a mounting pin is projected into lower side of said counter gear and one end of said hair spring is secured to an outer cylindrical surface of said bearing and the other end is secured to said mounting pin.

* * * * *